(12) United States Patent
Vanselow et al.

(10) Patent No.: US 7,800,454 B2
(45) Date of Patent: Sep. 21, 2010

(54) DIGITAL CONTROLLED OSCILLATOR

(75) Inventors: Frank Vanselow, Attenkirchen (DE);
Matthias Arnold, Freising (DE)

(73) Assignee: Texas Instruments Incorporated,
Dallas, TX (US)

( * ) Notice: Subject to any disclaimer, the term of this patent is extended or adjusted under 35 U.S.C. 154(b) by 134 days.

(21) Appl. No.: 12/176,514

(22) Filed: Jul. 21, 2008

(65) Prior Publication Data

US 2009/0045880 A1    Feb. 19, 2009

Related U.S. Application Data

(60) Provisional application No. 61/016,743, filed on Dec. 26, 2007.

(30) Foreign Application Priority Data

Jul. 23, 2007    (DE) ...................... 10 2007 034 186

(51) Int. Cl.
*H03B 5/12* (2006.01)
*H03C 3/09* (2006.01)

(52) U.S. Cl. .................. 331/36 C; 331/1 R; 331/25; 331/74; 331/111; 331/143

(58) Field of Classification Search ............... 331/1 R, 331/25, 36, 74, 111, 143
See application file for complete search history.

(56) References Cited

U.S. PATENT DOCUMENTS

| | | | |
|---|---|---|---|
| 3,688,211 A | 8/1972 | Calaway | |
| 5,343,169 A | 8/1994 | Debaty | |
| 5,532,653 A * | 7/1996 | Adkins | 331/143 |
| 5,832,048 A * | 11/1998 | Woodman, Jr. | 375/376 |
| 5,881,374 A | 3/1999 | Oesterberg | |
| 6,359,948 B1 | 3/2002 | Turudic et al. | |
| 6,614,318 B1 * | 9/2003 | Boecker | 331/17 |
| 7,061,296 B2 * | 6/2006 | Friedrich et al. | 327/299 |
| 7,145,402 B2 * | 12/2006 | Mattila et al. | 331/66 |
| 7,167,060 B2 * | 1/2007 | Cho et al. | 331/143 |
| 7,471,143 B2 * | 12/2008 | Kim | 329/312 |
| 2002/0041217 A1 | 4/2002 | Crofts et al. | |
| 2002/0121940 A1 | 9/2002 | Chrissostomidis et al. | |
| 2006/0034409 A1 * | 2/2006 | Aoyama et al. | 375/376 |
| 2007/0103244 A1 | 5/2007 | D'Abramo et al. | |

FOREIGN PATENT DOCUMENTS

| | | |
|---|---|---|
| DE | 600 00 750 T2 | 7/2003 |
| EP | 1 030 451 B1 | 11/2002 |

* cited by examiner

*Primary Examiner*—Arnold Kinkead
*Assistant Examiner*—Richard Tan
(74) *Attorney, Agent, or Firm*—Robert D. Marshall, Jr.; W. James Brady; Frederick J. Telecky, Jr.

(57) ABSTRACT

A digital controlled oscillator including a programmable current source, a first variable capacitor and a second variable capacitor. A comparator compares the voltage across the variable capacitors with a reference voltage level and generates a DCO output clock signal. A switching means alternately switches the variable capacitors to either charge from a programmable current source or discharge in response to an output signal of the comparator. A clock divider divides the DCO output clock signal by a factor N substantially greater than 1. A frequency monitor receives the divided clock signal, determines the time difference of successive clock periods of the divided clock signal and generates a feedback signal to adapt the frequency of the DCO output clock signal.

6 Claims, 4 Drawing Sheets

DIGITAL CONTROLLED OSCILLATOR

CLAIM OF PRIORITY

This application claims priority under 35 U.S.C. 119(a) to German Patent Application No. 10 2007 034 186.7 filed Jul. 23, 2007 and to U.S. Provisional Patent Application 61/016,743 filed Dec. 26, 2007.

TECHNICAL FIELD OF THE INVENTION

The present invention generally relates to an electronic device with a digital controlled oscillator (DCO).

BACKGROUND OF THE INVENTION

Fully integrated RC oscillators are limited in performance compared to oscillators that use a high Q resonator such as crystal oscillators. Initial frequency accuracy, frequency drift over temperature and voltage and phase noise are always worse in fully integrated oscillators than in an oscillator including a high Q resonator. However, it is desirable to use RC oscillators instead of crystal oscillators. Such RC oscillators can be fully integrated in a CMOS technology, thereby reducing complexity and production costs.

SUMMARY OF THE INVENTION

It is an object of the present invention to provide an electronic device including a digital oscillator with an improved accuracy and long term stability of oscillation frequency.

Accordingly, the present invention is an electronic device including a digital controlled oscillator. The digital controlled oscillator includes a programmable current source, a first variable capacitor and a second variable capacitor. A comparator compares the voltage drop across the variable capacitors with a reference voltage level and provides a DCO output clock signal. A switch alternately charges the variable capacitors from the programmable current source or discharges the variable capacitors in response to an output signal of the comparator. A clock divider divides the DCO output clock signal by a factor N, which is substantially greater than 1. A frequency monitor receives the divided clock signal. The frequency monitor determines the time difference of successive clock periods of the divided clock signal and generates a corresponding feedback signal. The DCO adjusts the DCO output clock frequency in response to the feedback signal. The DCO frequency may be advantageously varied by adapting the capacitance values of the variable capacitors with the feedback signal. The factor N is preferably chosen such that a period of the divided clock signal is in proportion to a temperature, supply voltage or other degradation induced deviation of the DCO output clock signal. The monitor advantageously compares pairs of consecutive divided clock periods, comparing each divided clock period with a preceding divided clock period and with a following divided clock period. This ensures continuous, consistent and reliable control.

In a conventional DCO architecture, component properties such as resistances, capacitance values, delay times, comparator offset voltages etc. are temperature and supply voltage dependent. Even with a high-precision reference voltage or current generator (e.g. bandgap reference voltage source) the achievable overall accuracy of the oscillator will be in a range of 2% to 5%. The initial oscillator frequency can be trimmed easily by various means. For example, the reference current or the capacitors can be changed by a trimming scheme. However, to get the overall accuracy of the oscillator in the range of a crystal oscillator (e.g. 20 to 50 ppm), further improvements are required.

Accordingly, the present invention chooses the factor N in accordance with a temperature deviation and/or a supply voltage induced deviation or any similar slow deviation to be compensated. As long as the deviation is relatively slow compared with the oscillating frequency, the present invention provides a convenient, easy and effective means to scale the frequency deviation in the oscillator output frequency. It is therefore a special aspect of the invention to scale down a DCO output frequency in a range where a clock frequency of a downscaled clock signal can be used as an indicator for a frequency deviation, which is much slower than the DCO clock frequency. The frequency deviation is determined in a differential and self-regulating manner. Successive clock periods of the downscaled clock are compared with each other and the comparison result is used to adjust the DCO frequency.

Preferably, the frequency monitor comprises an adjustable current source, three calibration capacitors, a comparator, and a switch to alternately couple one of the three calibration capacitors to the adjustable current source and the other two calibration capacitors to the second comparator in order to compare the voltage levels on the calibration capacitors. A controller controls the switch so that that one of the calibration capacitors is successfully charged with the current from the adjustable current source over a period of the divided clock signal to a respective maximum voltage level. Two maximum voltage levels are then consecutively selected and compared by the comparator in each clock period of the divided clock. A reference signal is generated by a voltage ramp. This voltage ramp is sampled by the oscillator output signal. The difference in amplitude of two successive samples is a measure of the frequency drift or change. This drift is used as an input for a digital control block implemented by the controller. The output of the controller then controls the three calibration capacitors. To optimize the tuning process, the digital control block can use an algorithm (e.g. a search algorithm), for example a binary weighting scheme. This achieves both coarse and fine tuning of the feedback loop.

Preferably, the device further comprises a weighting stage coupled between the output of the second comparator and the variable capacitors of the digital controlled oscillator for weighting the output signal of the second comparator. This weighting stage can include a counter, which is increased and decreased in response to the comparator output. The counter can be an up-and-down counter, such that if the voltage difference is positive, the counter value is increased by 1, but if the voltage difference is negative, the counter value will be decreased by 1. The output of the counter or an average value then controls the capacitive array by adjusting the capacitance of the first and second capacitors up or down to compensate for frequency drift of the output signal of the DCO. Although it is preferred to adjust the capacitance of the DCO, other ways to adjust the DCO frequency are generally conceivable, like adjusting a current in the DCO or a resistor.

Preferably, each of the variable capacitors comprises two portions. In the first portion the capacitance is adjusted in response to the feedback signal. In the second portion has a constant capacitance value. This means that the fine tuning of the DCO output clock signal can be achieved by varying the capacitance of the variable capacitors around their constant value.

The present invention also provides a method for adjusting the oscillation frequency of a digital controlled oscillator. The method comprises dividing the frequency of the output clock signal of the DCO, comparing the length of successive periods of the divided clock signal and adjusting the output clock frequency of the DCO in response to the comparison. The frequency drift of the DCO is mainly caused by limited power supply rejection (PSRR) of the oscillator and temperature/voltage drift of component parameters. The present invention establishes a self-control mechanism, wherein the instantaneous frequency of the DCO oscillating frequency is determined in successive points in time. The difference of these measurement results (i.e. the difference of the length or duration of the different periods) is directly proportional to the frequency change and is advantageously used in a control loop to reduce the error. Advantageously, a variable capacitor in the DCO can be adjusted for tuning the frequency. Preferably pairs of consecutive clock periods of the divided clock signal are compared. Firstly, a first clock period of the divided clock signal is compared with a second clock period and next the second clock period is compared with a third clock period. Accordingly, each clock period of the divided clock signal is compared with a predecessor and a successor. This provides continuous and reliable control. The method of the present invention provides an advantage in not using an amplitude control loop or phase locked loop scheme, where the oscillating frequency is compared with a reference signal. Instead, the circuit uses a mainly digital tuning and trimming scheme in a feedback configuration, thereby establishing a self-controlling DCO. This allows a very simple and area-efficient implementation of a fast acquisition scheme, due to the mainly digital realization of the circuitry. No complex low-frequency analog filters are required for the control loop. Furthermore, the present invention provides the advantages of a reliable operation. An area-efficient implementation is also provided, which has a wide operating frequency range (e.g. 100 kHz to 40 MHz). Additionally, the adjustable current source providing current for the three capacitors can be implemented so as to be adjustable on the basis of the resistance of a single resistor. If such a resistor is implemented externally, i.e. not integrated with the other components on the same die, the high accuracy of the device depends only on an external resistor and can be easily adjusted.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
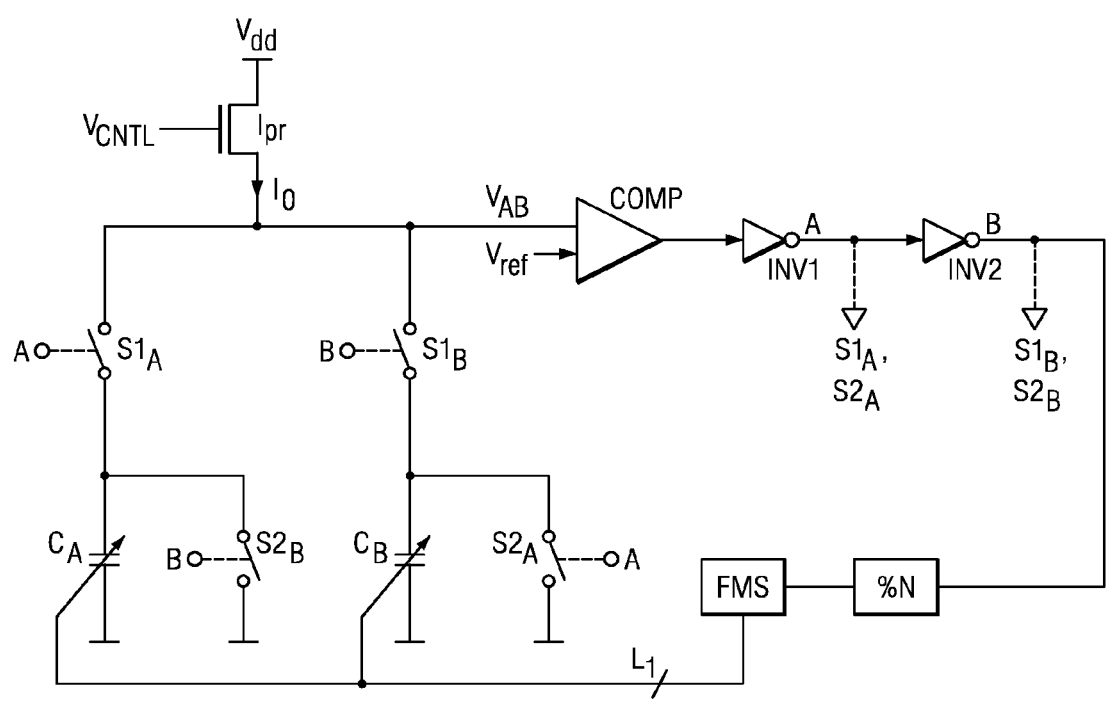
FIG. 1 is a simplified circuit diagram of a digital controlled oscillator for use in the device according to a first embodiment of the invention.

FIG. 1 shows a digital controlled oscillator (DCO) as part of the device according to the invention. A programmable current source $I_{pr}$, implemented in a MOS transistor, is connected between a supply voltage rail $V_{dd}$ and a voltage rail $V_{AB}$. This programmable current source $I_{pr}$ provides a reference current $I_0$. The gate terminal of the MOS transistor implementing the current source $I_{pr}$ receives a control voltage VCNTL. The voltage rail $V_{AB}$ supplies one input of a comparator COMP. A reference voltage $V_{ref}$ supplies the other input of the comparator COMP. The output of the comparator COMP supplies the input of inverter INV1. The output of inverter INV1 supplies the input of another inverter INV2. The output of inverter INV2 supplies an input a divide by N clock divider % N. The output of clock divider % N supplies the input of frequency monitor FMS. The output of frequency monitor FMS is connected to bus $L_1$. Inverter INV1 outputs a first control signal A and inverter INV2 outputs a second control signal B, which is the inverse of the control signal A.

Two capacitors $C_A$ and $C_B$ are connected in parallel with each other between the voltage rail $V_{AB}$ and ground via respective switches $S1_A$ and $S1_B$. Both capacitors $C_A$ and $C_B$ are also connected to the bus $L_1$. Bus $L_1$ supplies the signal from which is operable to vary the capacitance of the capacitors $C_A$ and $C_B$. Capacitor $C_A$ may be connected to ground by switch $S2_B$. Capacitor $C_B$ may be connected to ground by switch $S2_A$. Switch $S2_A$ is also connected to a node interconnecting the switch $S1_B$ and the capacitor $C_B$. Switch $S2_B$ is connected to a node interconnecting the switch $S1_A$ and the capacitor $C_A$. Switches $S1_A$ and $S2_A$ are controlled by the signal A output from the inverter INV1 and the switches $S1_B$ and $S2_B$ are controlled by the signal B output from the inverter INV2. The switches can be implemented by MOS transistors, for example.

In operation, the comparator COMP compares the voltage drop across variable capacitors $C_A$ and $C_B$ at the voltage rail $V_{AB}$ with the reference voltage $V_{ref}$. The output of the comparator COMP is then the DCO output clock signal, which is generated based on the difference between the voltage $V_{AB}$ and the reference voltage $V_{ref}$. If the voltage at the voltage rail $V_{AB}$ is greater than reference voltage $V_{ref}$, the output of comparator COMP will be positive. This causes the output signal A output from the inverter INV1 to negative and the output signal B output from the inverter INV2 to positive. The switches $S1_A$ and $S2_A$ are thus opened and the switches $S1_B$ and $S2_B$ are closed. Capacitor $C_A$ discharges to ground via the closed switch $S2_B$ and capacitor $C_B$ is charged by the reference current $I_0$. If the voltage at the voltage rail $V_{AB}$ is less than reference voltage $V_{ref}$, the output of comparator COMP is negative and the opposite of the above occurs, so that the output signal A is positive and the signal B is negative. Switches $S1_A$ and $S2_A$ are closed and switches $S1_B$ and $S2_B$ are opened. Thus capacitor $C_B$ discharges to ground via closed switch $S2_A$ and capacitor $C_A$ is charged by reference current $I_0$. Capacitors $C_A$ and $C_B$ are thus alternately switched to receive either current $I_0$ from the programmable current source $I_{pr}$ or to be discharged. Accordingly the DCO periodically toggles between charging and discharging capacitors $C_A$ and $C_B$. This generates the output of the DCO.

Figure 3:
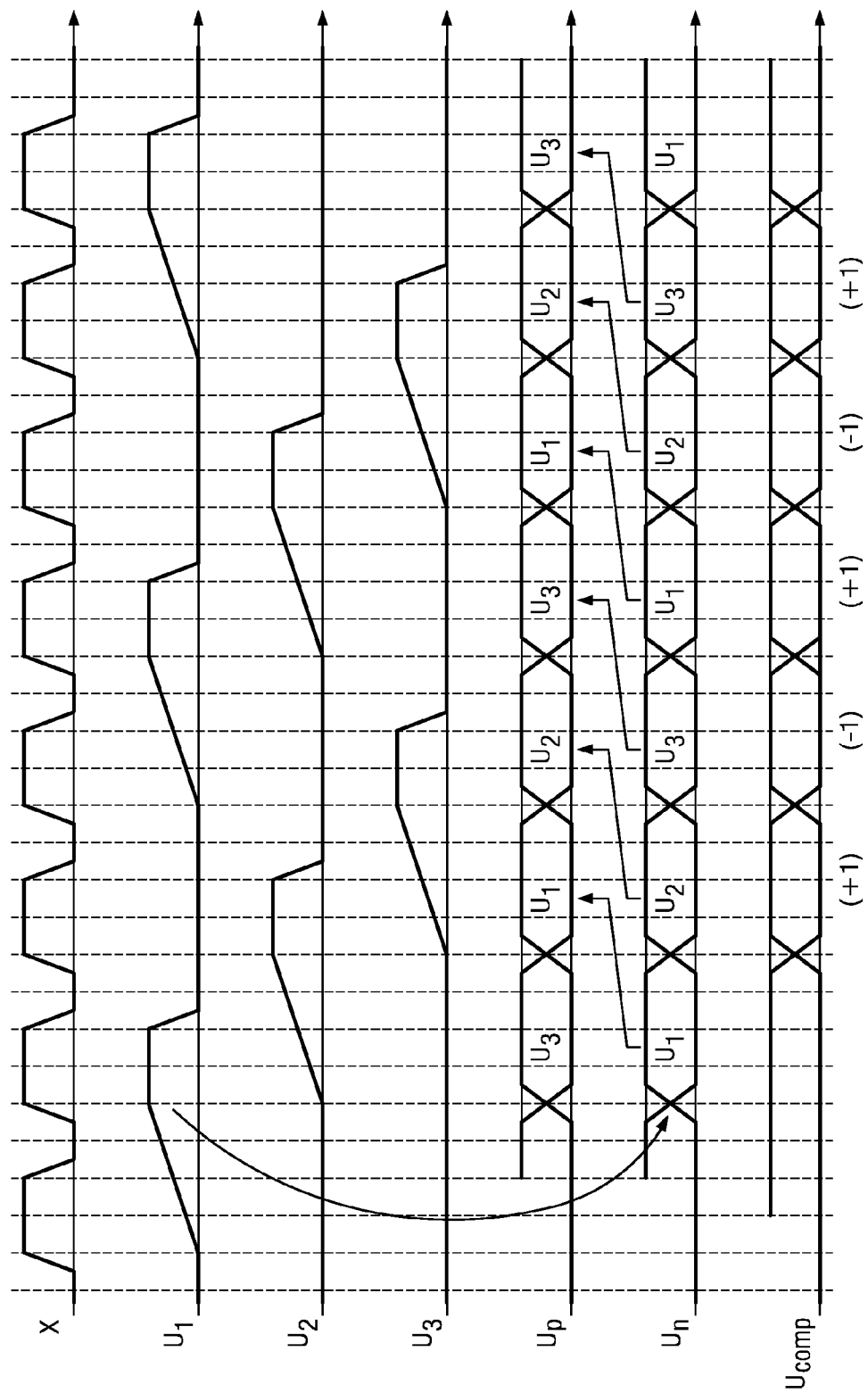
FIG. 3 illustrates frequency and voltage against time for the device of the present invention under stable conditions.
Figure 4:
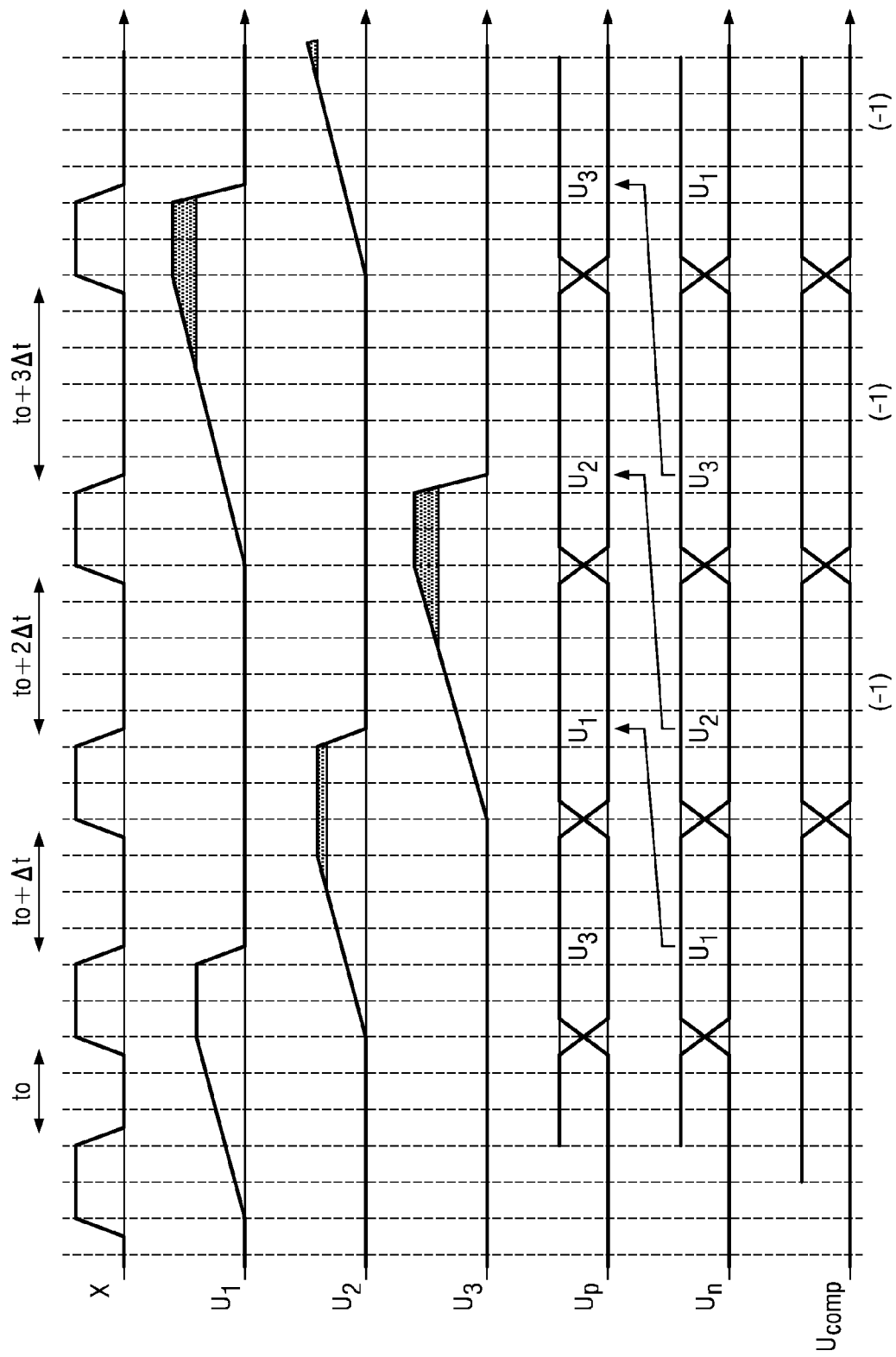
FIG. 4 illustrates frequency and voltage against time for a device according to the present invention under unstable conditions such as due to temperature drift.

Ideally, the output of the DCO looks like the uppermost diagram in FIG. 3. This shows the divided frequency output X as divided by the clock divider % N at the output of the comparator COMP versus time under stable conditions. In other words, the output of the DCO should be a regular periodic output signal with no frequency drift. However, any temperature change can cause the frequency to drift making the time period between successive output signals becomes longer and longer. FIG. 4 illustrates the divided frequency output X versus time in this case. The required time period between output signals is t0, which is the time gap between the first two signals. By the time the third signal is output, the time period between the second and third output signals increases to t0+Δt, between the third and fourth output signals to t0+2Δt, and so on, increasing by an amount Δt after every consecutive output signal. To prevent this frequency drift, the clock divider % N is configured such that the factor N divides the output of the comparator COMP, the output of the DCO, choosing the period of the divided clock signal to compensate for a temperature or supply voltage induced deviation of the DCO output clock signal. Generally, the control loop established through divider % N, frequency monitor FMS and the adjustable capacitors has a characteristic (delay, settling time, frequency response, etc.), which provides a stable feedback control in proportion to a specific frequency deviation relating to a temperature or supply voltage. Frequency monitor FMS then receives the divided frequency output X as a clock signal and determines the time difference between successive clock periods of clock signal X. Frequency monitor FMS generates a feedback signal in response to the determined time difference. The feedback signal then adjusts the capacitance values of the variable capacitors $C_A$ and $C_B$ up or down to compensate for the time difference. This corrects the frequency drift of the signal output from the DCO.

Figure 2:
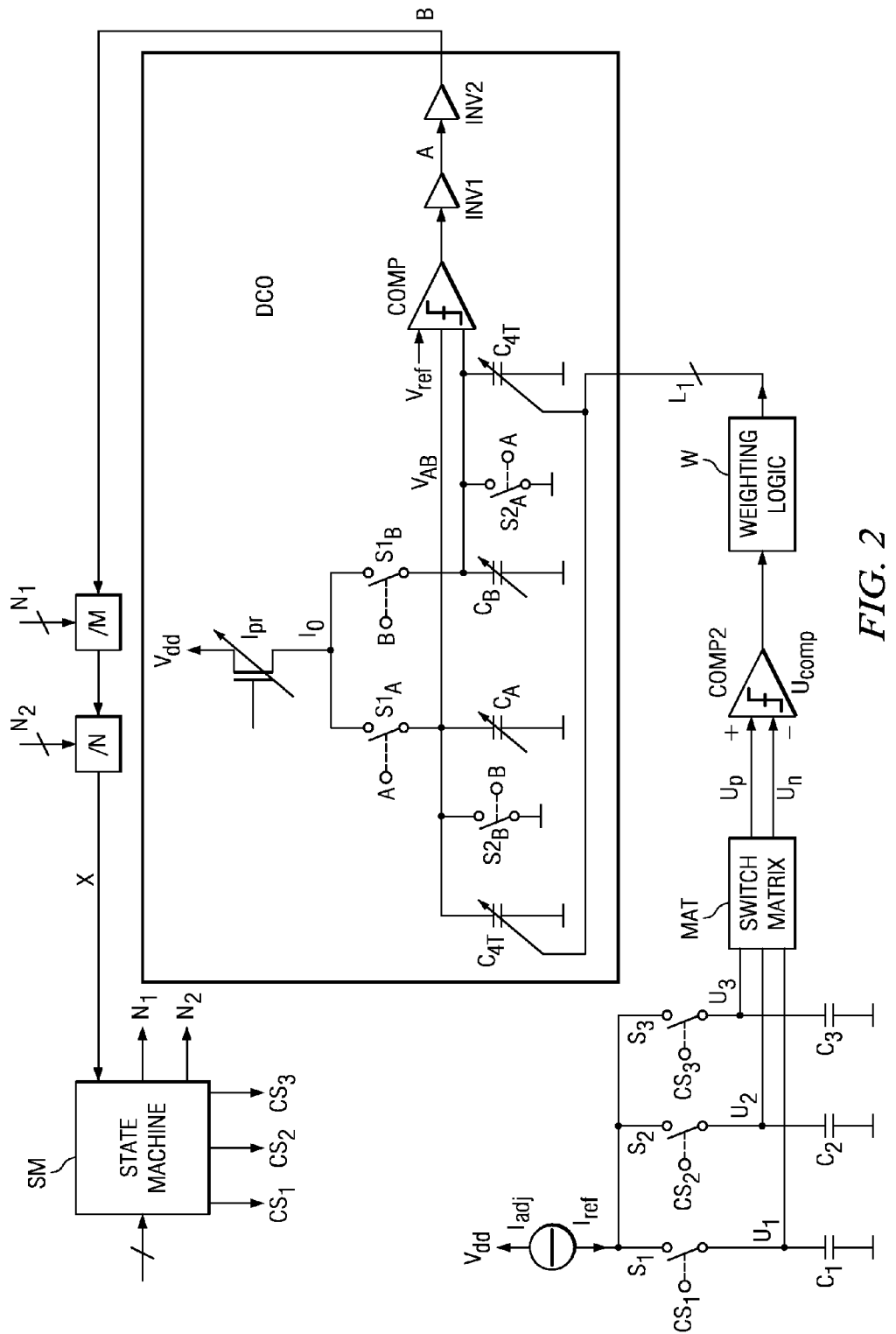
FIG. 2 is a simplified circuit diagram of a device according to a second embodiment of the invention.

FIG. 2 shows a specific implementation of the frequency monitor FMS. The components of the DCO are identical to those shown in FIG. 1 and will not be described further. In this embodiment, the clock divider % N is implemented as two clock dividers /M and /N connected in series. First clock divider /M is directly connected to the output of the second inverter INV2. The divided frequency output X is then output from second clock divider /N and fed to the input of state machine SM. State machine SM has several outputs. Two of the outputs are connected to control inputs of the clock dividers /M and /N. These output control signals N1 and N2 control the division factor of respective clock dividers /M and /N. A further three outputs are connected to three switches $S_1$, $S_2$ and $S_3$. These three outputs control signals $CS_1$, $CS_2$ and $CS_3$ to the three respective switches $S_1$, $S_2$ and $S_3$ to control switching of respective switches. Switches $S_1$, $S_2$ and $S_3$ are connected in parallel with each other between an adjustable current source $I_{adj}$ and three respective capacitors $C_1$, $C_2$ and $C_3$. Adjustable current source $I_{adj}$ is also connected to the supply voltage rail $V_{dd}$. Adjustable current source $I_{adj}$ can be implemented by a single resistor, which is preferably implemented externally to an integrated circuit incorporating the other components. This external resistor can be easily adjusted for calibration purposes. Three nodes $U_1$, $U_2$ and $U_3$ connect the switches $S_1$, $S_2$ and $S_3$ with the respective capacitors $C_1$, $C_2$ and $C_3$ and a switch matrix MAT. Nodes $U_1$, $U_2$ and $U_3$ represent the voltage across respective capacitors $C_1$, $C_2$ and $C_3$. Switch matrix MAT has two outputs $U_p$ and $U_n$. $U_p$ is connected to the positive input of a second comparator COMP2. $U_n$ is connected to the negative input of second comparator COMP2. The output of second comparator COMP2 generates an output signal $U_{comp}$ supplied to weighting logic stage W. The output of the weighting logic stage W is connected via bus $L_1$ to the control inputs of the variable capacitors $C_A$ and $C_B$ in the DCO. As illustrated in FIG. 2, weighting logic W may control only the two trimming capacitors $C_{4T}$.

FIGS. 3 and 4 show how the frequency monitor of the second embodiment works. FIGS. 3 and 4 illustrate six graphs of the voltages $U_1$, $U_2$, $U_3$, $U_p$, $U_n$ and $U_{comp}$ versus time below the graph of divided frequency output X. FIG. 3 shows the DCO under stable conditions and FIG. 4 shows the DCO when there is a drift in the output frequency due to, for example, temperature changes. Three calibration capacitors $C_1$, $C_2$ and $C_3$ are successively charged using a reference current $I_{ref}$ provided by the adjustable current source $I_{adj}$. The voltage on each capacitor is ramped up over a period of the divided clock signal to a respective maximum voltage level so that the nodes $U_1$, $U_2$ or $U_3$ are at the maximum voltage level of the respective capacitor $C_1$, $C_2$ or $C_3$. In FIGS. 3 and 4, the voltage at the node $U_1$ is ramped up to its maximum voltage level over the first clock period of the divided frequency output X. Control signal $CS_1$ from the state machine SM closes switch $S_1$ leaving switches $S_2$ and $S_3$ open. Capacitor $C_1$ charges with the reference current $I_{ref}$, so that the maximum voltage level at the node $U_1$ is reached and maintained for the duration of the output clock signal. For the second clock period of the output clock signal X, the voltage at the node $U_2$ is ramped up to a maximum level following the same procedure as above, control signal $CS_2$ closes switch $S_2$ to charge the capacitor $C_2$ with the reference current $I_{ref}$. During the third clock period, the voltage at the node $U_3$ is ramped up to a maximum level, because control signal $CS_3$ closes switch $S_3$ to charge capacitor $C_3$. This process is repeated continuously so that the voltage at the nodes $U_1$, $U_2$ and $U_3$ is consecutively ramped up in a continuous loop.

Switch matrix MAT then consecutively selects two of the maximum voltage levels at $U_1$, $U_2$ or $U_3$, designated $U_p$ and $U_n$ for output. These are input to the respective positive and negative inputs of second comparator COMP2. From FIGS. 3 and 4 it can be seen that, after the first period of the divided output clock signal X voltage at $U_3$ from the previous clock period is compared with the voltage $U_1$ from the current clock period, thus $U_p=U_3$ and $U_n=U_1$. Comparator COMP2 compares the two maximum voltage levels $U_p$ and $U_n$ from the current and previous output clock periods and outputs a signal $U_{comp}$ representative of the difference between the two voltage levels $U_p$ and $U_n$. Signal $U_{comp}$ output from the comparator COMP2 is then input to the weighting logic stage W. A counter in the weighting logic stage W is then either incremented or decremented in response to the output of comparator COMP2. The capacitance of capacitors $C_A$ and $C_B$ are varied up or down in response to the counter output. Weighting logic W may control only the two trimming capacitors $C_{4T}$. Thus the output signal of the DCO is maintained at a constant frequency. Additional weighting steps may be applied to the counter value for improved performance.

In FIG. 3, when the DCO is operating under ideal, stable conditions, the frequency of the divided DCO output clock signal X is constant. Thus voltages $U_p$ and $U_n$ are always equal and opposite and cancel each other out in comparator COMP2. The output of comparator COMP2 is then always zero, the counter in the weighting logic stage W does not count up and down and the capacitance of the capacitors $C_A$ and $C_B$ in the DCO remains constant. However, as shown in FIG. 4 when the DCO is operating under unstable temperature conditions where the output frequency drifts so that the time period between output signals increases, control signals $CS_1$, $CS_2$ and $CS_3$ output from state machine SM cause the switches $S_1$, $S_2$ and $S_3$ to respectively remain closed for progressively longer periods of time. The ramps of $U_1$, $U_2$, and $U_3$ still have the same slope, but they increase for a longer time. The increase which exceeds the ideal maximum voltage is indicates with a filled area on top of each of the voltages. The maximum voltage at the nodes $U_1$, $U_2$ and $U_3$ gets larger for each consecutive clock period. For the example shown in FIG. 4, the difference between the voltages $U_p$ and $U_n$ at the output of the comparator is −1 for each consecutive clock period. In response to the comparator result, the counter in weighting logic W counts down by 1 unit each clock period. This causes a decrease the capacitance of capacitors $C_A$ and $C_B$, thereby correcting the frequency drift of the output signal of the DCO.

The circuit according to the present invention establishes a self-regulating DCO. The characteristics can be adapted to any specific system requirements. The parameters of the circuitry, as for example the clock dividers, the capacitance of the capacitors, the magnitude of the currents, can be easily determined by empirical studies or simulations.

Although the present invention has been described with reference to specific embodiments, it is not limited to these embodiments and no doubt further alternatives will occur to the skilled person that lie within the scope of the invention as claimed.

What is claimed is:

1. A digital controlled oscillator (DCO), comprising:
   a programmable current source ($I_{pr}$);
   a first variable capacitor ($C_A$);
   a second variable capacitor ($C_B$);
   switching means connected to said programmable current source ($I_{pr}$), said first variable capacitor ($C_A$) and said second variable capacitor ($C_B$), said switching means operable to alternately (1) charge said first variable capacitor ($C_A$) with a current ($I_0$) from said programmable current source ($I_{pr}$) and discharge said second variable capacitor ($C_B$), and (2) charge said second variable capacitor ($C_B$) with said current ($I_0$) from said programmable current source ($I_{pr}$) and discharge said first variable capacitor ($C_A$);
   a comparator (COMP) connected to said switching means, said comparator (COMP) operable to compare the voltage across a charging one of the first and second variable capacitors ($C_A$, $C_B$) with a reference voltage level ($V_{ref}$) and generate a DCO output clock signal (B) corresponding to said comparison;
   a clock divider (% N) coupled to an output of the comparator (COMP) for dividing said DCO output clock signal (B) by a predetermined factor N substantially greater than 1 thereby generating a divided clock signal (X);
   a frequency monitor (FMS) receiving the divided clock signal (X), said frequency monitor (FMS) operable to determine the time difference of successive clock periods of the divided clock signal and to generate a feedback signal based on the determined time difference, said frequency monitor (FMS) being further operable to compare pairs of consecutive clock periods of said divided clock signal, such that each clock period of said divided clock signal is compared with a preceding clock period and with a following clock period of said divided clock signal, said frequency monitor (FMS) includes:
   an adjustable constant current source ($I_{adj}$),
   a first calibration capacitor ($C_1$),
   a second calibration capacitor ($C_2$),
   a third calibration capacitor ($C_3$),
   a second comparator (COMP2),
   a second switching means to alternately couple one of said first, second and third calibration capacitors ($C_1$, $C_2$, $C_3$) to said adjustable current source ($I_{adj}$) to charge said one capacitor, and two other of said first, second and third calibration capacitors ($C_1$, $C_2$, $C_3$) to the second comparator (COMP2) in order to compare the voltage levels on said other two of said first, second and third calibration capacitors, and
   a controlling means (CNTL) for controlling the switching means such that each one of said first, second and third calibration capacitors ($C_1$, $C_2$, $C_3$) is successively charged with a current from the adjustable current source ($I_{adj}$) over a period of the divided clock signal to a respective maximum voltage level, while two maximum voltage levels of the two other of said first, second and third calibration capacitors ($C_1$, $C_2$, $C_3$) are selected and compared by said second comparator (COMP2) in each clock period of said divided clock signal;
   wherein said feedback signal is coupled to said first and second variable capacitors ($C_A$, $C_B$); and
   wherein capacitance values of said first and second variable capacitors ($C_A$, $C_B$) are changed in response to the feedback signal in order to adjust the frequency of said DCO output clock signal (B).

2. The digital controlled oscillator (DCO) according to claim 1, wherein:
   said factor N is selected whereby a period of said divided clock signal is in proportion to a temperature or supply voltage induced deviation of said DCO output clock signal.

3. The digital controller oscillator (DCO) according to claim 1, wherein:
   said switching means is further connected to receive said DCO output clock signal and is further operable to alternate in synchronism with said DCO output clock signal.

4. The digital controlled oscillator (DCO) according to claim 1, further comprising:
   a weighting logic (W) coupled between a output of said second comparator (COMP2) and said variable capacitors ($C_A$, $C_B$) for weighting the output signal of the second comparator (COMP2) to change said capacitance values of said first and second variable capacitors ($C_A$, $C_B$).

5. The digital controlled oscillator (DCO) according to claim 4, wherein:
   said weighting logic (W) includes a counter which is increased and decreased corresponding to an output of said second comparator (COMP2).

6. The digital controlled oscillator (DCO) according to claim 1, wherein:
   each of said first and second variable capacitors ($C_A$, $C_B$) comprises two portions, a first portion having a capacitance adjusted in response to said feedback signal and a second portion having a constant capacitance.

* * * * *